United States Patent [19]

Yamada et al.

[11] Patent Number: 5,243,223
[45] Date of Patent: Sep. 7, 1993

[54] SEMICONDUCTOR DEVICE HAVING HOUSING WITH A GELLED FILLER AND AN INTERNAL PRESSURE ABSORBING CHAMBER

[75] Inventors: Toshifusa Yamada; Hiroaki Matsushita, both of Kanagawa, Japan

[73] Assignee: Fuji Electronic Co., Ltd., Kanagawa, Japan

[21] Appl. No.: 827,611

[22] Filed: Jan. 29, 1992

[30] Foreign Application Priority Data

Feb. 25, 1991 [JP] Japan .................... 3-28976
Aug. 21, 1991 [JP] Japan .................... 3-208361

[51] Int. Cl.⁵ .................... H01L 23/42; H01L 23/44; H01L 23/46; H01L 29/44
[52] U.S. Cl. .................... 257/789; 257/714; 257/790; 257/791; 257/795
[58] Field of Search .................... 357/81, 82, 80, 74, 357/72, 79; 257/667, 714, 787, 788, 789, 791, 790, 795

[56] References Cited

FOREIGN PATENT DOCUMENTS 0251260 6/1987 European Pat. Off. .
0384482 2/1990 European Pat. Off. .
91-57944 6/1991 Japan .

OTHER PUBLICATIONS

European Search Report dated Jun. 4, 1992.
Patent Abstracts of Japan, vol. 10, No. 209, Jul. 22, 1986 (for Japanese Patent No. 61-48947 issued Mar. 10, 1986).

Primary Examiner—Andrew J. James
Assistant Examiner—Carl Whitehead, Jr.
Attorney, Agent, or Firm—Finnegan, Henderson, Farabow, Garrett & Dunner

[57] ABSTRACT

A semiconductor device includes a housing, a semiconductor element disposed in a lower section inside the housing, an external lead terminal at least partially disposed within the housing, a gelled filler disposed within the housing, the semiconductor element and at least a portion of the external lead terminal being embedded in the gelled filler, a hardened sealing resin layer disposed over the gelled filler, and at least one internal pressure absorbing chamber having a pocket-type sealed space, the internal pressure absorbing chamber passing through the sealing resin layer and being open at an upper surface side of the gelled filler. The semiconductor device prevents a rise in the internal pressure of the housing in response to thermal expansion of the gelled filler sealed within the housing, and the absorption of external moisture by the gelled filler. When the gelled filler expands according to a heat cycle, its increase in volume is absorbed by the internal pressure absorbing chamber to prevent leakage of the gelled filler and the application of stress to the semiconductor element. The absorption of moisture from the air outside of the semiconductor device by the gelled filler is prevented by defining the internal pressure absorbing chamber as a tightly closed pocket-type space to ensure that the semiconductor device is intrinsically resistant to humidity.

3 Claims, 2 Drawing Sheets

SEMICONDUCTOR DEVICE HAVING HOUSING WITH A GELLED FILLER AND AN INTERNAL PRESSURE ABSORBING CHAMBER

BACKGROUND OF THE INVENTION

1. Field of the Invention

The present invention relates to a semiconductor device which is intended for use in transistor modules and the like. More particularly, the present invention relates to a semiconductor device constructed to prevent the leakage of filler from the device, and the exposure of the filler to water.

2. Discussion of the Related Art

A conventional semiconductor device has been embodied as a package formed by combining a base, which functions as a radiator panel, with a case or housing made of an insulative material. In addition to the package (i.e., the base and the housing), the semiconductor device includes a semiconductor element chip, an external lead terminal, a gelled resin filler (e.g., a silicone resin), and a sealing resin (e.g., an epoxy resin). The semiconductor device is constructed by filling the housing with the gelled resin filler, such that the semiconductor element is embedded in a lower area inside the housing, applying the sealing resin on the gelled resin filler, and hardening the sealing resin.

The silicone gel or resin used as the gelled resin filler within the housing has a larger coefficient of thermal expansion than other sealing resin materials (such as the epoxy resin). Further, in the conventional semiconductor device, when the gelled resin filler expands in volume along with a rise in temperature resulting from a heat cycle of the semiconductor device, the excess volume of the gelled resin filler resulting from the expansion causes the generation of an internal pressure that cannot be relieved. As a result, stress induced by the internal pressure caused by the excess volume of the gelled resin filler may be applied to the semiconductor element chip, thereby causing the formation of cracks in the semiconductor element chip.

The same stress may also cause the gelled resin filler to break a bonded portion of the base and the housing, resulting in leakage of the filler from the semiconductor device. In particular, if the gelled resin filler suddenly expands due to an abnormal heat generation (such as the heat generation caused by an overcurrent flowing through the semiconductor element chip), the housing may break abruptly, thereby allowing the contents of the housing to splash out and affect ambient objects outside of the semiconductor device.

In view of the foregoing problems, a semiconductor device has been proposed wherein the housing of the semiconductor device is provided with a vent hole that penetrates to the gelled resin filler through the thermosetting resin for communication between the gelled resin filler and the outside air. This type of device is discussed in Japanese Utility Model Application No. Hei. 1-119534 as preventing breakage of the housing and leakage of the gelled resin filler from the semiconductor device. In accordance with the construction of this type of semiconductor device, the expansion in volume of the gelled resin filler that occurs along with the rise in temperature is absorbed by the capacity of the vent hole. At the same time, excessive pressure in the housing can be released to the outside air through the vent hole.

The provision of the vent hole in the housing reduces leakage of the gelled resin filler from the housing and prevents breakage of the housing in situations where the internal pressure of the housing increases. This result is obtained because the vent hole allows the absorption of increases in the volume of the gelled resin filler that occur upon expansion of the gelled resin filler. Nevertheless, the provisions of semiconductor device with a vent hole in the housing does not produce entirely satisfactory results. More particularly, the gel used in the semiconductor device having a vent hole has a high water absorptivity and, therefore, the gelled resin filler used in the semiconductor device may absorb moisture from the outside air through the vent hole and swell during use of the semiconductor device so that the dielectric strength characteristics of the semiconductor device are adversely affected.

SUMMARY OF THE INVENTION

The present invention has been made in view of the above circumstances and has as an object to provide a highly reliable semiconductor device capable of reducing leakage of the gelled resin filler from the semiconductor device and preventing the gelled resin filler from being exposed to water (i.e., preventing the gelled resin filler from absorbing external moisture).

The semiconductor device of the present invention accomplishes the above object by the provision of a sealed pocket-type space serving as an internal pressure absorbing chamber in the semiconductor device. The internal pressure absorbing chamber passes through the sealing resin layer and is open above an upper surface of the gelled filler. Also, the internal pressure absorbing chamber may be located at a plurality of dispersed positions within the semiconductor device.

The spatial capacity of the internal pressure absorbing chamber in the semiconductor device is set at a capacity value larger than the increase in volume the gelled filler undergoes in response to a rise in temperature. The internal pressure absorbing chamber may be formed inside a partition wall that extends downwardly from an upper cover of the semiconductor device housing to penetrate through the sealing resin layer so that an extreme end of the partition wall is buried in a layer of the gelled filler.

The construction of the semiconductor device of the present invention allows a voluminal increase of the gelled resin filler (i.e., an expanded portion of the gelled resin filler), resulting from a rise in temperature in response to a heat cycle of the semiconductor device, to enter into the internal pressure absorbing chamber for absorption by the internal pressure absorbing chamber. Although the air in the internal pressure absorbing chamber is compressed, the reactive force associated with the compressed air is extremely small as compared to the pressure associated with the expanded portion of the gelled resin filler, and therefore does not affect the absorbing function of the chamber. Because the internal pressure absorbing chamber comprises a tightly closed or sealed pocket-type space that does not communicate with the air outside of the semiconductor device, the gelled filler does not absorb moisture from the air outside of the semiconductor device during use of the semiconductor device. In this way, the deterioration of the electrical characteristics of the semiconductor device is prevented.

In one embodiment of the present invention, the internal pressure absorbing chamber is formed by combining a first partition wall with a second partition wall. The first partition wall extends inwardly from a side wall of the semiconductor device housing and penetrates through the sealing resin layer. An upper end of the first partition wall is exposed and open above the sealing resin layer, and a lower end of the first partition wall is buried in a layer of the gelled filler. The second partition wall extends downwardly from an upper cover of the semiconductor device housing and surrounds the upper open end of the first partition wall. An extreme end of the second partition wall is buried in the sealing resin layer.

In the case where the internal pressure absorbing chamber is formed by combining first and second partition walls, it is recommended that the thermosetting resin used to form the sealing resin layer be introduced into the semiconductor device housing before the upper cover of the housing is fitted on the housing, and that the thermosetting resin be hardened after the upper cover is fitted on the housing. Further, in the construction of this embodiment, the space surrounded by the first partition wall is open to the air outside of the semiconductor device before the upper cover of the housing is fitted on the housing. Under this condition, the space surrounded by the first partition wall is heated at the same time the thermosetting resin (i.e., an epoxy resin) used to form the sealing resin layer is heated. More particularly, when the epoxy resin is heated to a softening temperature in order to fill a portion of the housing with the sealing resin layer, the space surrounded by the first partition wall is also heated. As a result, the moisture in this space is expelled to the air outside of the semiconductor device, because the heating of the thermosetting resin in the housing is carried out before the upper cover of the housing is fitted on the housing.

In the embodiment wherein the internal pressure absorbing chamber is formed by combining first and second partition walls, the thermosetting resin is hardened by heating after the upper cover has been fitted on the housing. The upper cover of the housing is simultaneously fixed to the sealing resin layer at the fitting position when the epoxy resin is hardened after the upper cover of the housing (which is provided with the second partition wall) has been fitted on the housing. In this way, the process of applying a bonding agent between the housing and the upper cover of the housing, to bond the housing to the upper cover, can be omitted.

Additional objects and advantages of the invention will be set forth in the description which follows and in part will be obvious from the description, or may be learned by the practice of the invention. The objects and advantages of the invention may be realized and attained by means of the instrumentalities and combinations particularly pointed out in the appended claims.

To achieve the objects and in accordance with the purpose of the invention, as embodied and broadly described herein, the semiconductor device of the invention comprises: a housing, a semiconductor element disposed in a lower section inside the housing, an external lead terminal at least partially disposed within the housing, a gelled filler disposed within the housing, the semiconductor element and at least a portion of the external lead terminal being embedded in the gelled filler, a hardened sealing resin layer disposed over the gelled filler, and at least one internal pressure absorbing chamber having a pocket-type sealed space, the internal pressure absorbing chamber passing through the sealing resin layer and being open at an upper surface side of the gelled filler.

BRIEF DESCRIPTION OF THE DRAWINGS

The accompanying drawings, which are incorporated in and constitute a part of this specification, illustrate embodiments of the invention and, together with the description, serve to explain the objects, advantages and principles of the invention. In the drawings:

FIG. 3($b$) is a plan view of the semiconductor device in accordance with the third embodiment of the present invention with the upper cover of the device being excluded; and FIG. 3($c$) is a fragmentory perspective view of elements included in the semiconductor device of the third embodiment.

DESCRIPTION OF PREFERRED EMBODIMENTS

Preferred embodiments of the present invention will now be described in detail with reference to the accompanying drawings.

Figure 1:
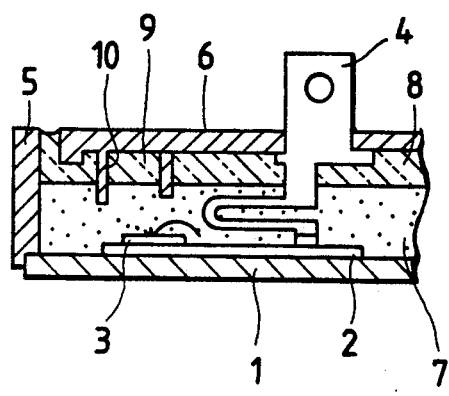
FIG. 1 is a fragmentory cross-sectional view of a semiconductor device in accordance with a first embodiment of the present invention.

In accordance with a first embodiment of the present invention, shown in FIG. 1, a semiconductor device includes a metal base 1 that functions as a radiator plate, an insulation plate 2 fitted on the metal base 1, and a semiconductor element 3 (e.g., a transistor) mounted on the insulation plate 2. The semiconductor device of FIG. 1 also includes an external lead terminal 4, an insulative case or housing 5, comprising a molded resin product, and an upper cover 6 that functions as a cover for the insulative housing 5.

The base 1, the housing 5 and the upper cover 6 form a package or container in which the elements of the semiconductor device are at least partially disposed. In constructing the semiconductor device, a lower section of the container is filled with a gelled resin filler 7 (e.g., a silicone resin) so that the semiconductor element 3 and part of the external lead terminal 4 are embedded in the gelled resin filler 7. Also, an upper section of the container over the gelled resin filler 7 is filled with a sealing resin layer 8 (e.g., an epoxy resin), and then the sealing resin layer is hardened.

An internal pressure absorbing chamber 9 is also formed inside the container (i.e., inside the housing 5). The internal pressure absorbing chamber 9 comprises a tightly closed or sealed pocket-type space that penetrates through the sealing resin layer 8 and is open above the upper surface of the gelled resin filler 7. The internal pressure absorbing chamber 9 is defined by a tubular partition wall 10 that is formed integral with the upper cover 6 and extends downwardly from a rear side of the upper cover. Moreover, the partition wall 10 is dimensioned such that, for example, the partition wall penetrates through the sealing resin layer 8, and a free end of the partition wall is buried in a layer of the gelled resin filler 7. The internal capacity of the internal pressure absorbing chamber 9 is set to a value that is at least larger than a voluminal increase (i.e., an increase in volume) which the gelled resin filler 7 undergoes in response to a specified rise in temperature.

In constructing the semiconductor device of FIG. 1, the open end face of the internal pressure absorbing chamber 9 is closed by (i.e., sealed with) the gelled resin filler 7. The resulting internal pressure absorbing chamber 9 is filled with air trapped by the partition wall 10 and the gelled resin filler 7. When the gelled resin filler 7 expands along with a rise in temperature that occurs during the use of the semiconductor device, its voluminally increased portion (i.e., the excess volume of the gelled resin filler resulting from the temperature rise) enters into the internal pressure absorbing chamber 9 so that the increased pressure due to the increased volume is absorbed and relieved.

In the foregoing embodiment, the air within the internal pressure absorbing chamber 9 of the semiconductor device is compressed. From a trial comparison in accordance with the law of Boyle and Charles, it has been found that the pressure affecting the compressed air in the chamber 9 (i.e., the pressure resulting from the expansion in volume of the gelled resin filler 7) is approximately 1/100 of the pressure affecting the gelled resin 7 (i.e., the reactive force or pressure of the compressed air). As a result, the absorbing function performed by the internal pressure absorbing chamber 9 is relatively unaffected, so that the expanded portion of the gelled resin filler 7 (i.e., the excess volume of the filler 7) resulting from a rise in temperature or an increase in pressure within the semiconductor device can be absorbed reliably by the internal pressure absorbing chamber 9. In addition, because the internal pressure absorbing chamber 9 comprises a tightly closed or sealed space that does not communicate with the external air outside of the semiconductor device, the gelled resin filter 7 will not absorb moisture from the external air during use of the semiconductor device.

The aforementioned characteristics of the first embodiment of the present invention have been confirmed by tests conducted by the inventors of the present invention. It should be noted that the internal pressure absorbing chamber 9 is not limited to one position, as in the first embodiment shown in FIG. 1. Rather, the internal pressure absorbing chamber 9 can be provided at a plurality of dispersed positions inside the container (e.g., the semiconductor device container may include a plurality of internal pressure absorbing chambers located at different positions inside the semiconductor device).

Figure 2:
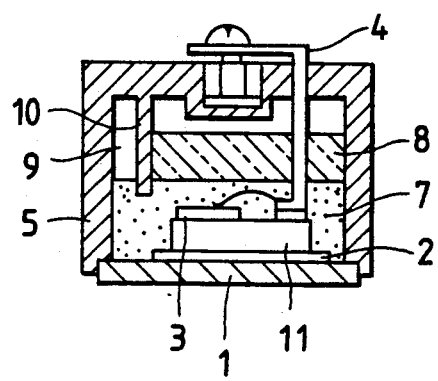
FIG. 2 is a cross-sectional view of a semiconductor device in accordance with a second embodiment of the present invention.

In a second embodiment of the present invention shown in FIG. 2, the internal pressure absorbing chamber 9 is defined by a side wall of a housing 5 (which is molded integral with an upper cover 6) and a partition wall 10 extending inwardly from the upper cover 6 into the housing. The construction of the semiconductor device of the second embodiment, shown in FIG. 2, provides similar effects and advantages as those provided by the semiconductor device of the first embodiment, shown in FIG. 1.

Figure 3A:
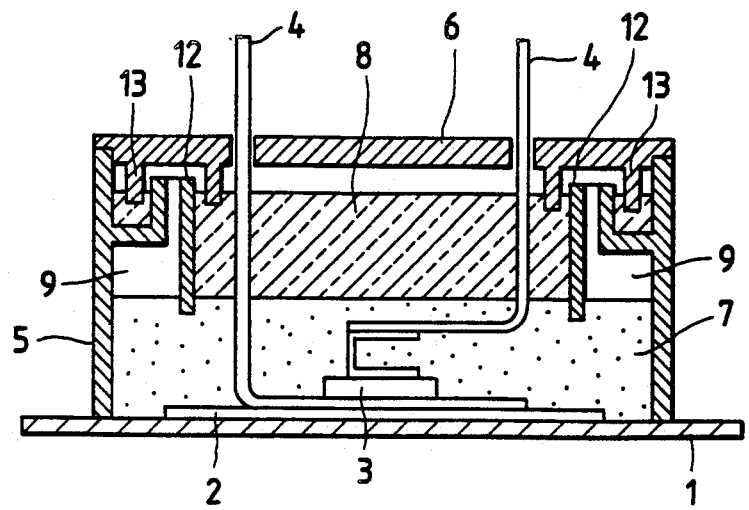
FIG. 3($a$) is a vertical cross-sectional view of a semiconductor device in accordance with a third embodiment of the present invention.

In accordance with a third embodiment of the present invention as shown in FIG. 3(a), the closed or sealed pocket-type space of the internal pressure absorbing chamber 9 is defined by a first partition wall 12 provided inside a side wall of the housing 5 and a second partition wall 13 provided on the upper cover 6 of the housing. As can be seen from FIG. 3(c), which is a perspective view of certain elements included in the semiconductor device of FIG. 3(a), the first partition wall 12 consists of an L-shaped partition wall portion 12a and a square tubular partition wall portion 12b. The L-shaped partition wall portion 12a extends inwardly from the housing 5 and the square tubular partition wall portion 12b is connected to and extends upwardly from the partition wall portion 12a.

The partition wall 12 is dimensioned so that an upper end of the tubular partition wall portion 12b penetrates through the sealing resin layer 8 and is exposed open and above the sealing resin layer 8, and so that a lower end of the L-shaped partition wall portion 12a is buried in a layer of the gelled resin filler 7. Further, as can be seen from both FIG. 3(b), which is a plan view of the semiconductor device of FIG. 3(a) without its upper cover, and FIG. 3(a), the second partition wall 13 is dimensioned so that it functions as a tubular partition wall extending downwardly from the upper cover 6 and surrounding the open end of the tubular partition wall portion 12b, and so that a lower end of the second partition wall 13 is buried in the sealing resin layer 8. A thermosetting resin such as an epoxy resin may be used to form the sealing layer 8.

Details of the construction of the semiconductor device of FIG. 3(a), such as the steps of filling the semiconductor container with the gelled resin filler and filling the semiconductor container with the sealing resin, will now be described. While the housing 5 is fixed to the metal base 1 with a bonding agent, a lower section of the semiconductor device container is filled with the gelled resin filler 7 before the upper cover 6 is fitted on the housing 5. Subsequently, an epoxy resin serving as the sealing resin layer 8 is heated at a softening temperature, and applied onto the tubular partition wall portion 12b of the first partition wall 12. The tubular partition wall portion 12b penetrates through the sealing resin layer 8 and is exposed open and above the sealing resin layer so that moisture in the internal space of the second partition wall 12 is expelled to the air outside of the semiconductor device by heating. Then, after the upper cover 6 has been fitted on the housing 5 and the second partition wall 13 has been inserted so that its lower end is buried in the sealing resin layer 8, the epoxy resin of the sealing resin layer 8 is hardened by heating the whole housing. At the same time the sealing resin layer 8 is hardened, the upper cover 6 of the housing is fixed to the sealing resin layer 8 at a fitting position (e.g., the position where the upper cover 6 was fitted on the housing 5). The internal pressure absorbing chamber 9 resulting from the foregoing construction comprises a tightly closed or sealed pocket-type space defined in the housing 5 by the first partition wall 12 and the second partition wall 13.

When the temperature returns to room temperature after the epoxy resin has been heated and hardened, the gelled resin filler 7 and the epoxy resin thermally shrink, and the spatial capacity of the internal pressure absorbing chamber 9 slightly increases in accordance with such thermal shrinkage. As a result, the internal pressure of the closed internal pressure absorbing chamber 9 is smaller than the external atmospheric pressure. Accordingly, when the gelled resin filler 7 expands along with a rise in temperature during a subsequent heat cycle, the corresponding rise in internal pressure within the internal pressure absorbing chamber 9 remains relatively small so that safe operation of the semiconductor device can be ensured.

As described above, the present invention provides a highly reliable semiconductor device that is intrinsically resistant to humidity. Further, the semiconductor device of the present invention relieves the amount of stress applied to the semiconductor element, and prevents leakage of the gelled resin filler from the housing, by absorbing voluminal expansions of the gelled resin filler and increases in internal pressure resulting from heat cycles in the internal pressure absorbing chamber.

Also, the semiconductor device of the present invention includes a partition wall provided on the upper cover of the housing and dimensioned so that a lower end of the partition wall is buried in the sealing resin layer. As a result, the upper cover of the housing is fixed at the same time the sealing resin is hardened. For this reason, the additional step of fixing the upper cover to the housing with a bonding agent can be eliminated, thereby reducing costs and decreasing the time required to construct the semiconductor device.

Figure 3B:
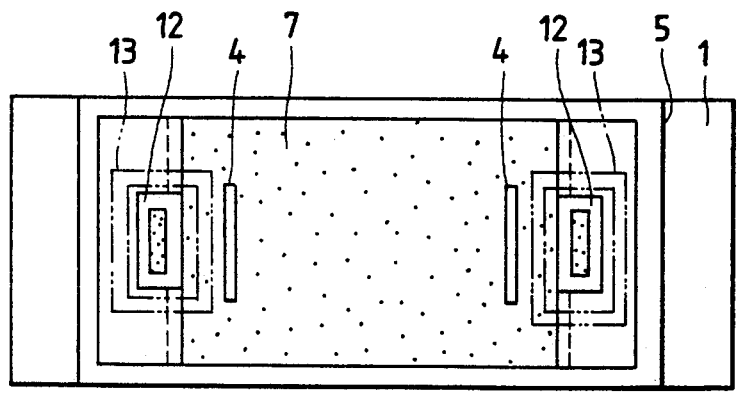
Figure 3C:
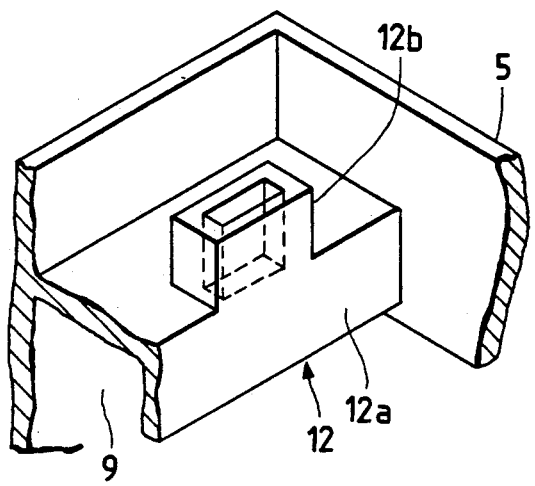

Further, the construction of the semiconductor device of the third embodiment, illustrated in FIGS. 3(a)-3(c), allows moisture from the space of the internal pressure absorbing chamber to be expelled by means of heating process when the sealing resin is applied to the semiconductor device.

The foregoing description of preferred embodiments of the invention has been presented for purposes of illustration and description. It is not intended to be exhaustive or to limit the invention to the precise form disclosed, and modifications and variations are possible in light of the above teachings or may be acquired from practice of the invention. The embodiments were chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalents.

What is claimed is:

1. A semiconductor device comprising:
   a housing having a side wall and an upper cover;
   a semiconductor element disposed in a lower section inside the housing;
   an external lead terminal at least partially disposed within the housing;
   a gelled filler disposed within the housing, the semiconductor element and at least a portion of the external lead terminal being embedded in the gelled filler;
   a hardened sealing resin layer disposed over the gelled filler;
   at least one internal pressure absorbing chamber having a pocket-type sealed space, the internal pressure absorbing chamber passing through the sealing resin layer and being open at an upper surface side of the gelled filler;
   a first partition wall extending inwardly from the side wall of the housing and penetrating the sealing resin layer, the first partition wall having an upper end that is open and exposed above the sealing resin layer and a lower end that is buried in the gelled filler; and
   a second partition wall extending downwardly from the upper cover of the housing and surrounding the upper end of the first partition wall, the second partition wall having an extreme end buried in the sealing resin layer, and the internal pressure absorbing chamber being defined by both the first and second partition walls.

2. A semiconductor device in accordance with claim 1, wherein the internal pressure absorbing chamber has a space capacity set at a space capacity value, and the space capacity value is larger than a voluminal increase which the gelled filler undergoes in response to an increase in temperature.

3. A semiconductor device in accordance with claim 1, wherein the sealing resin layer comprises a thermosetting resin, the housing is filled with the thermosetting resin before an upper cover is fitted on the housing, and the thermosetting resin is hardened after the upper cover is fitted on the housing.

* * * * *

UNITED STATES PATENT AND TRADEMARK OFFICE
CERTIFICATE OF CORRECTION

PATENT NO. : 5,243,223
DATED : September 07, 1993
INVENTOR(S) : Toshifusa Yamada et al.

It is certified that error appears in the above-indentified patent and that said Letters Patent is hereby corrected as shown below:

On title page, item [73] change "Fuji Electronic Co., Ltd. to --Fuji Electric Co., Ltd.--

Signed and Sealed this

Twelfth Day of April, 1994

Attest:

BRUCE LEHMAN

*Attesting Officer*   *Commissioner of Patents and Trademarks*